United States Patent [19]

Muramatsu

[11] Patent Number: 5,661,481
[45] Date of Patent: Aug. 26, 1997

[54] A/D CONVERTER USING RESISTOR LADDER NETWORK AND METHOD OF TESTING THE SAME

[75] Inventor: Kunio Muramatsu, Yokosuka, Japan

[73] Assignee: Kabushiki Kaisha Toshiba, Kawasaki, Japan

[21] Appl. No.: 454,532

[22] Filed: May 30, 1995

[30] Foreign Application Priority Data

May 31, 1994 [JP] Japan ................... 6-119383

[51] Int. Cl.$^6$ .................................... H03M 1/10
[52] U.S. Cl. ................. 341/120; 341/156; 341/158; 341/159
[58] Field of Search ................. 341/120, 121, 341/154, 158, 159, 156

[56] References Cited

U.S. PATENT DOCUMENTS

| | | | |
|---|---|---|---|
| 4,903,028 | 2/1990 | Fukushima | 341/156 |
| 5,124,704 | 6/1992 | Kase et al. | 341/120 |
| 5,182,560 | 1/1993 | Shiwaku | 341/158 |

OTHER PUBLICATIONS

Data Book, Analog Devices Co., May 1988, AD9002, pp. 11–297 to 11–302 (translation was not provided) (the reference is in Japanese).

*Primary Examiner*—Jeffrey A. Gaffin
*Assistant Examiner*—Thuy-Trang N. Huynh
*Attorney, Agent, or Firm*—Oblon, Spivak, McClelland, Maier & Neustadt, P.C.

[57] ABSTRACT

An A/D converter and a method of testing the same. Resistors R1 to Rn are connected in series between power-supply terminals receiving a high potential and a low potential, respectively. The potentials at the nodes of the resistors R1 to Rn are input to voltage comparators C1 to Cn-1, respectively. Each comparator compares the input potential with an input signal Vin. The output signals of comparator is supplied to an encoder. The encoder converts the input signals into a digital signal. A test terminal is connected to one of the nodes of the resistors R1 to Rn. Either the high potential at the terminal or the low potential at the terminal is applied to the test terminal to test the A/D converter.

11 Claims, 10 Drawing Sheets

A/D CONVERTER USING RESISTOR LADDER NETWORK AND METHOD OF TESTING THE SAME

BACKGROUND OF THE INVENTION

1. Field of the Invention

The present invention relates to an A/D converter and also to a method of testing the A/D converter.

2. Description of the Related Art

Figure 1:
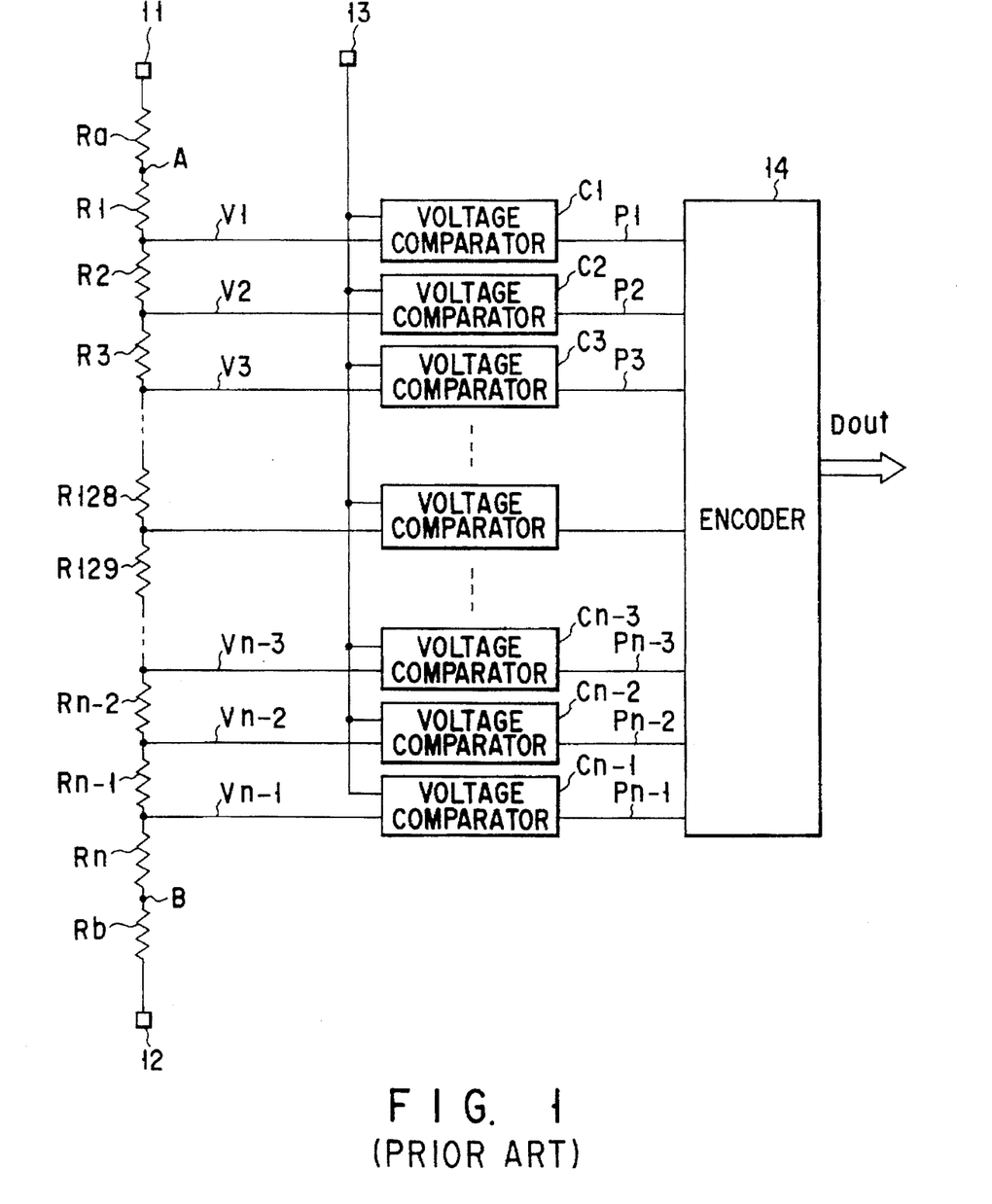
FIG. 1 is a circuit diagram showing a conventional A/D converter.

As is known, an A/D converter is a device which converts an analog signal to a digital signal. FIG. 1 shows a conventional A/D converter, which will be described below.

The A/D converter is incorporated within an integrated circuit (IC). It has two power-supply terminals 11 and 12. A high reference potential (e.g. 5 V) is externally applied to the first power-supply terminal 11, while a low reference potential (e.g., 0 V) is externally applied to the power-supply terminal 12.

The A/D converter further comprises resistors Ra and Rb and n resistors R1 to Rn, which are connected in series between the power-supply terminals 11 and 12. The resistor Ra is connected to one end of a series of the resistors R1 to Rn, and the resistor Rb to the other end of the series.

The resistors Ra and Rb determine the highest and lowest level of an input signal (i.e., an analog signal) which the A/D converter can detect. Neither the resistor Ra nor the resistor Rb will be required if the A/D converter is designed to detect signals at any level.

The resistors R1 to Rn determine the number of potential levels which are generated in the A/D converter. If the A/D converter is an 8-bit converter, requires 256 (=$2^8$) resistors R1 to R256. The resistors R1 to Rn divide the voltage applied between the node A of the resistors Ra and R1 and the node B of the resistors Rb and Rn.

The potentials V1 to Vn-1 at the nodes of the resistors R1 to Rn are applied to two-input voltage comparators C1 to Cn-1, respectively. An input signal Vin is supplied to the voltage comparators C1 to Cn-1 from an input terminal 13. Each of the voltage comparators compares the potential of the input signal Vin with the potential at one node of resistors.

If the potential of the input signal Vin is higher than that at the node of resistors, each voltage comparator will output a high-level signal. Conversely, if the potential of the input signal Vin is lower than the potential at the node of resistors, the voltage comparator will output a low-level signal.

The signals P1 to Pn-1, thus output by the voltage comparators C1 to Cn-1 are supplied to an encoder 14. The encoder 14 converts the signals P1 to Pn-1 to a digital signal Dout which consists of m bits (e.g., 8 bits).

The input level which the A/D converter can detect and convert into a digital signal falls within a range which is determined by the potential Vtop at the node A and the potential Vbottom at the node B. This range will be broadest if neither the resistor Ra nor the resistor Rb is provided and if the highest potential (usually, the power-supply potential Vcc) applicable to the IC is applied to the power-supply terminal 11 and the ground potential is applied to the power-supply terminal 12. It follows that the difference between any adjacent two of the potential levels generated in the m-bit A/D converter is 2m (=n) times as low as the power-supply potential Vcc.

To determine the operating characteristic of an A/D converter which outputs a digital signal consisting of many bits, it is necessary to apply to the A/D converter various voltages which differ by a value equal to or less than the difference between any adjacent two of the potential levels generated in the A/D converter. Hitherto, an analog tester has been used to test multi-bit A/D converters. The analog tester can output various voltages which differ by such a small value, but is very expensive.

Furthermore, a signal input to the A/D converter may contain a noise which is greater than the difference between any adjacent two of the potential levels generated in the A/D converter. If this is the case, the analog tester can no longer serve to accomplish an accurate testing of the A/D converter.

SUMMARY OF THE INVENTION

The object of the present invention is to provide an A/D converter which can be tested correctly, not affected by noise, by means of a tester which has a lower precision and which is therefore less expensive, and to provide a method of testing the A/D converter with high accuracy by using a relatively low-precision and inexpensive analog tester.

According to a first aspect of the invention there is provided an A/D converter which comprises: a first power-supply terminal for receiving a first potential; a second power-supply terminal for receiving a second potential; an input terminal for receiving an analog signal; a plurality of resistors connected in series between the first and second power-supply terminals, forming nodes; a plurality of comparators connected to the nodes of the resistors, respectively, for comparing a potential of the analog signal with potentials at the nodes of the resistors and generating signals, each corresponding to a difference between the potential of the analog signal and the potential at a node; an encoder for converting the signals generated by the comparators into a digital signal; and a test terminal connected to one of the nodes of the resistors, for applying a third potential or a fourth potential to the one node to test the A/D converter. The third potential is equal to the first potential, and the fourth potential is equal to the second potential. The first potential is a high-level reference potential, and the second potential is a low-level reference potential. The test terminal remains open while the A/D converter is operating in normal conditions.

According to a second aspect of this invention there is provided an A/D converter which comprises: a first power-supply terminal for receiving a first potential; a second power-supply terminal for receiving to a second potential; an input terminal for receiving an analog signal; a first group of resistors connected in series, forming nodes and a series circuit having one end connected to the first power-supply terminal; a second group of resistors connected in series, forming nodes and a series circuit having one end connected to the second power-supply terminal; a plurality of comparators connected to the nodes of the resistors of the first and second groups, respectively, for comparing a potential of the analog signal with potentials at the nodes of the resistors of the first and second groups and generating signals, each corresponding to a difference between the potential of the analog signal and the potential at a node; an encoder for converting the signals generated by the comparators of the first and second groups, into a digital signal; a first test terminal connected to the other end of the series circuit formed by the resistors of the first group, for applying a third potential to the other end of the series circuit formed by the resistor of the first group; and a second test terminal connected to the other end of the series circuit formed by the resistors of the second group, for applying a fourth potential to the other end of the series circuit formed by the resistor of the second group. The third potential is equal to the second potential, and the fourth potential is equal to the first potential. The first potential is a high-level reference potential, and the second potential is a low-level reference potential. The first and second test terminals are electrically connected to each other while the A/D converter is operating in normal conditions.

According to a third aspect of the invention there is provided an A/D converter which comprises: a first power-supply terminal for receiving a first potential; a second power-supply terminal for receiving a second potential; an input terminal for receiving an analog signal; a plurality of resistors connected in series between the first and second power-supply terminals, forming nodes; a plurality of comparators connected to the nodes of the resistors, respectively, for comparing a potential of the analog signal with potentials at the nodes of the resistors and generating signals, each corresponding to a difference between the potential of the analog signal and the potential at a node; an encoder for converting the signals generated by the comparators into a digital signal; a first switch connected between the first power-supply terminal and one of the nodes of the resistors, for electrically connecting the first power-supply terminal to the one of the nodes of the resistors; and a second switch connected between the second power-supply terminal and the one of the nodes of the resistors, for electrically connecting the second power-supply terminal to the one of the nodes of the resistors. The A/D converter further comprises a test terminal or receiving a test signal, and a control circuit for turning the first switch on and the second switch off, or vice versa, in accordance with the test signal supplied from the test terminal. The first potential is a high-level reference potential, and the second potential is a low-level reference potential. The first switch and the second switch remain off while the A/D converter is operating in normal conditions.

According to a fourth aspect of the invention there is provided a method of testing an A/D converter having a first power-supply terminal for receiving a first potential, a second power-supply terminal for receiving a second potential, and a plurality of resistors connected in series between the first and second power-supply terminals, forming nodes. The method comprises the steps of: connecting a test terminal to one of the nodes of the resistors; applying the second potential to the test terminal, thereby to test the resistors connected between the first power-supply terminal and the test terminal; and applying the first potential to the test terminal, thereby to test the resistors connected between the second power-supply terminal and the test terminal. The test terminal remains open while the A/D converter is operating in normal conditions.

According to a fifth aspect of the invention there is provided a method of testing an A/D converter, which comprises the steps of: connecting a first group of resistors in series between a first test terminal and a first power-supply terminal for receiving a first potential; connecting a second group of resistors in series between a second test terminal and a second power-supply terminal for receiving a second potential; applying the second potential to the first test terminal, thereby to test the resistors connected between the first power-supply terminal and the first test terminal; and applying the first potential to the second test terminal, thereby to test the resistors connected between the second power-supply terminal and the second test terminal. The first and second test terminals are electrically connected to each other while the A/D converter is operating in normal conditions.

According to a sixth aspect of the invention there is provided a method of testing an A/D converter having a first power-supply terminal for receiving a first potential, a second power-supply terminal for receiving a second potential, and a plurality of resistors connected in series between the first and second power supply terminals, forming nodes. This method comprises the steps of: connecting a first switch between the first power-supply terminal and one of the nodes of the resistors; connecting a second switch between the second power-supply terminal and the one of the nodes of the resistors; turning the first and second switches off and on, respectively, thereby to test the resistors connected between the first power-supply terminal and the one node of the resistors; and turning the first and second switches on and off, respectively, thereby to test the resistors connected between the second power-supply terminal and the one node of the resistors. The first switch and the second switch remain off while the A/D converter is operating in normal conditions.

The A/D converter according to the first aspect of the invention has a test terminal from which a predetermined potential is applied to one of the nodes of the resistors. The A/D converter can be tested with high accuracy, shortly before it is shipped, merely by applying the predetermined potential to that node.

In the A/D converter according to the second aspect of the invention, the first series of resistors is connected between the first power-supply terminal and the first test terminal, and the second series of resistors is connected between the second power-supply terminal and the second test terminal. To test the A/D converter shortly before shipment, predetermined potentials are applied to the first and second test terminals. By virtue of the potentials thus applied, the A/D converter can be tested with accuracy by means of an inexpensive analog tester which cannot output various voltage differing by a sufficiently small value.

In the A/D converter according to the third aspect of the present invention, the first switch is connected between the first power-supply terminal and one of the nodes of the resistors, and the second switch is connected between the second power-supply terminal and another of the nodes of the resistors. Either the first switch or the second switch is closed to test the A/D converter immediately before shipment. Hence, the A/D converter can be tested with accuracy by means of an inexpensive analog tester which cannot output various voltage differing by a sufficiently small value.

In the methods of testing an A/D converter, according to the fourth to sixth aspects of this invention, any two adjacent potential levels are made to have a potential difference which is greater than the potential difference they have while the A/D converter is operating. The A/D converter can therefore be tested with accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

PIG. 5 is a circuit diagram showing an A/D converter which is a second embodiment of the present invention.

PIG. 9 is a diagram explaining how to test the A/D converter shown in FIG. 8.

DETAILED DESCRIPTION OF THE PREFERRED EMBODIMENTS

The A/D converter and the method of testing the same, both according to the present invention, will now be described in detail.

Figure 2:
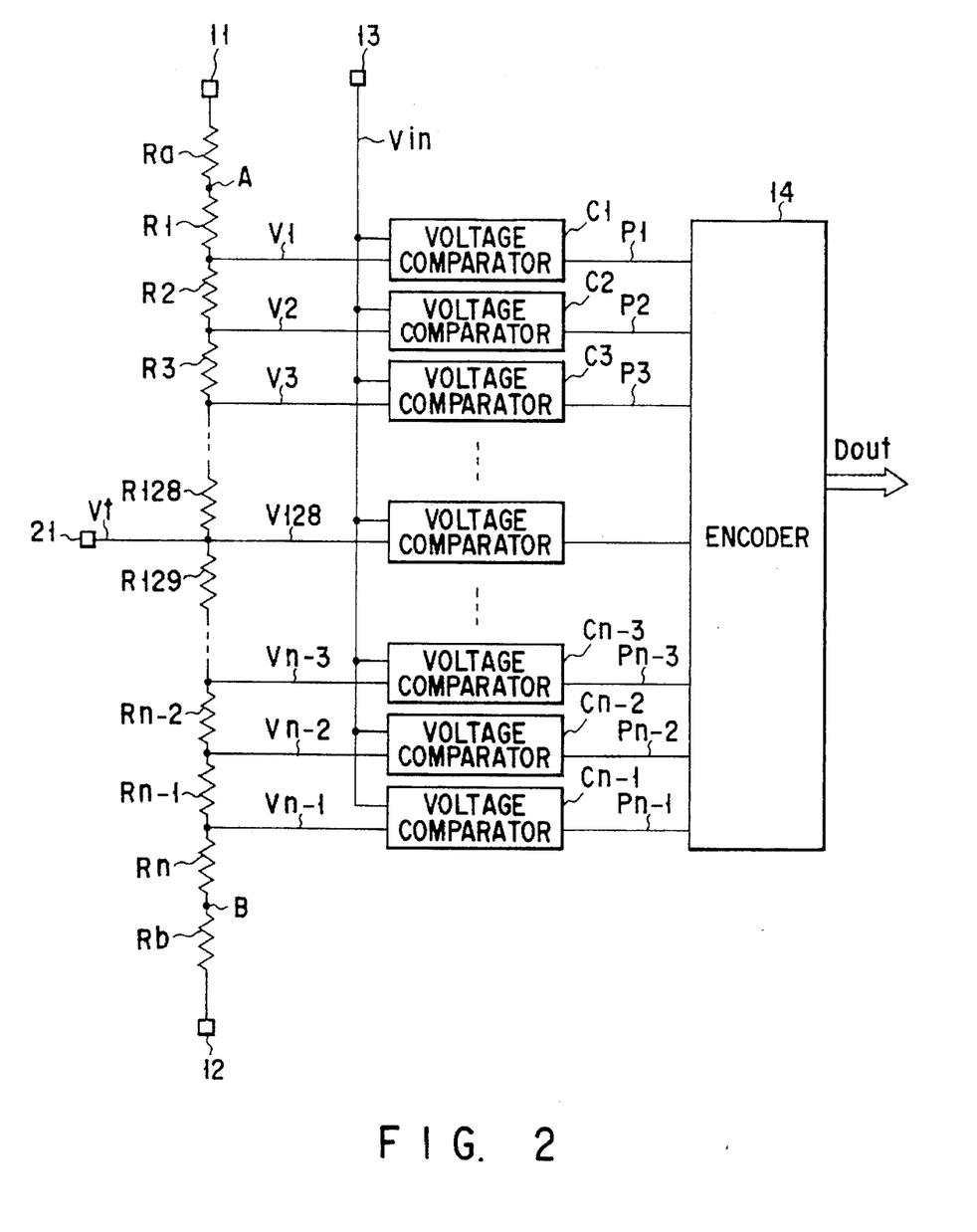
FIG. 2 is a circuit diagram showing an A/D converter which is a first embodiment of the present invention.

FIG. 2 shows an A/D converter according to the first embodiment of the invention. The A/D converter is formed in an IC. It has two power-power supply terminals 11 and 12. A high-level reference potential (e.g., 5 V) is applied to the first power-supply terminal 11 from an power supply provided outside the IC. A low-level reference potential (e.g., 0 V) is applied to the second power-supply terminal 12 from another power supply provided outside the IC.

Resistors Ra and Rb and n resistors R1 to Rn are connected in series between the power-supply terminals 11 and 12. More precisely, the resistors R1 to Rn are connected in series, and the resistors Ra and Rb are connected to the end of the series constituted by the resistors R1 to Rn.

The resistors Ra and Rb determine the highest and lowest level of an input signal (i.e., an analog signal) which the A/D converter can detects. Neither the resistor Ra nor the resistor Rb is required if the A/D converter is designed to detect signals at any level.

The resistors R1 to Rn determine the number of potential levels which can be provided in the A/D converter. If the A/D converter is an 8-bit converter, it requires 256 (=$2^8$) resistors R1 to R256. The resistors R1 to Rn divide the voltage applied between the node A of the resistors Ra and R1 and the node B of the resistors Rb and Rn.

At least one of the n-1 nodes among the resistors R1 to Rn is connected to a test terminal 21 to which a predetermined potential is applied. In the present embodiment, the midpoint of the series formed of the resistors R1 to Rn (the node of the resistors R128 and R129, if n=256) is connected to the test terminal 21. To test the A/D converter, the predetermined potential Vt (e.g., the power-supply potential or the ground potential) is applied to the test terminal 21 from a power supply provided outside the IC.

The potentials V1 to Vn-1 at the nodes of the resistors R1 to Rn are applied to n-1 voltage comparators C1 to Cn-1, respectively. An input signal Vin is supplied to the voltage comparators C1 to Cn-1 via an input terminal 13 from a device provided outside the IC. Hence, each voltage comparator compares the potential of the input signal Vin with the potential at the node of two adjacent resistors other than the resistors Ra and Rb. If the potential of the input signal Vin is higher than that at the resistor node, the voltage comparator generates a high-level signal. If the potential of the input signal Vin is lower than the potential at the resistor node, the voltage comparator generates a low-level signal.

The signals P1 to Pn-1 the voltage comparators C1 to Cn-1 have generated are input to an encoder 14. The encoder 14 converts the signals P1 to Pn-1 to a digital signal Dout which consists of m bits (for example, m=8).

How to test the A/D converter described above will be explained, with reference to FIGS. 3 and 4.

Figure 3:
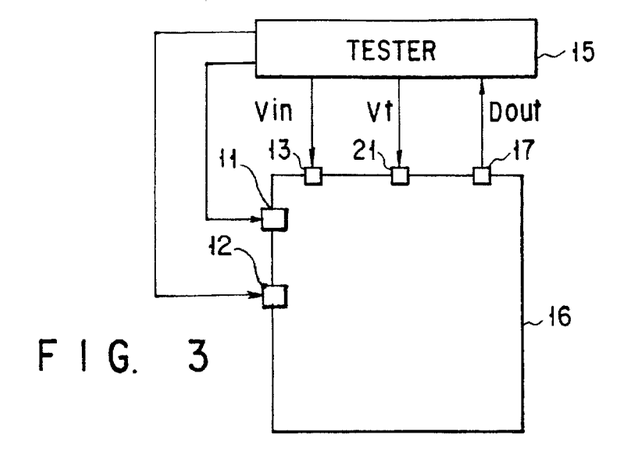
FIG. 3 is a diagram explaining how to test the A/D converter shown in FIG. 2.
Figure 4:
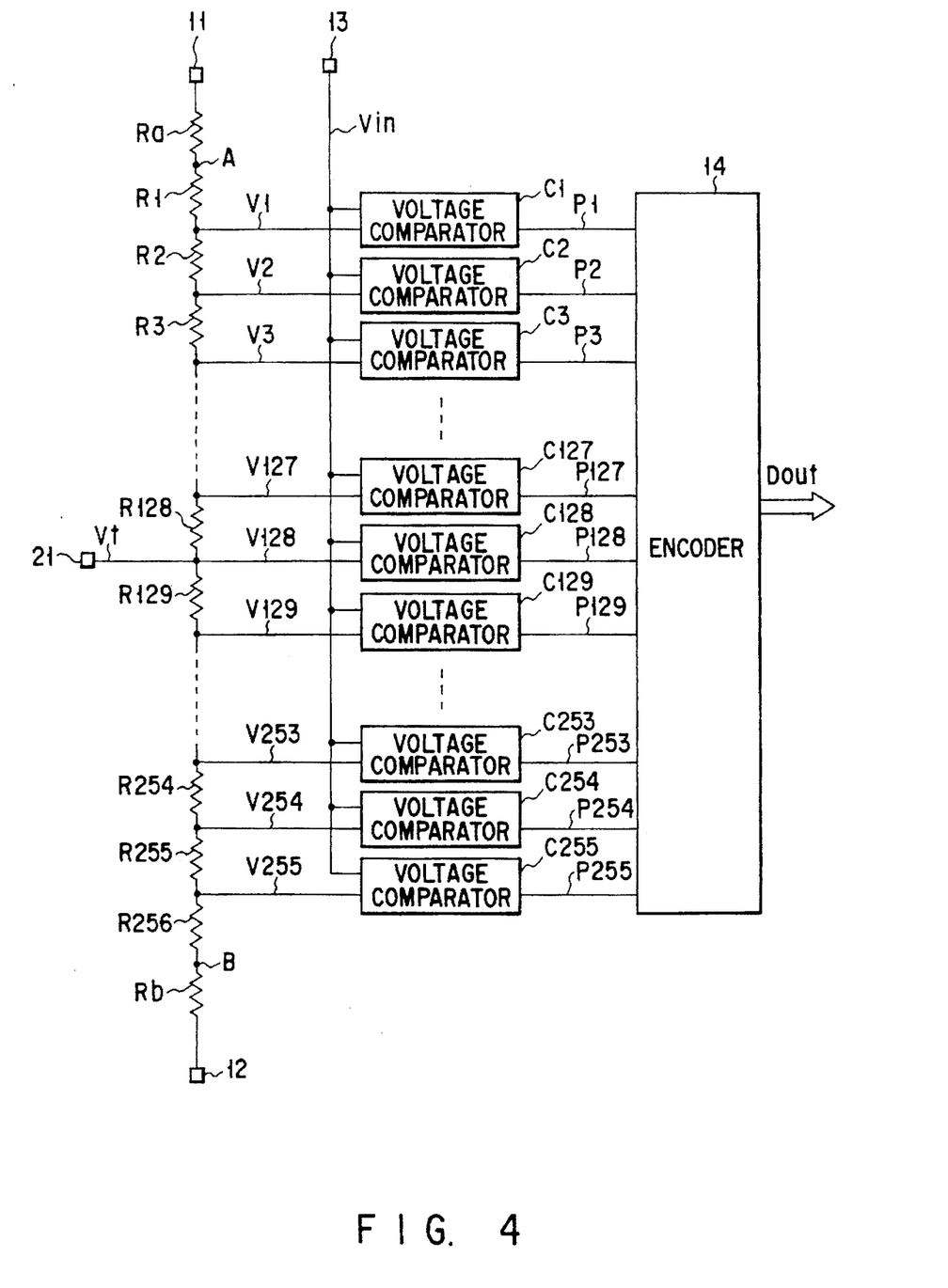
FIG. 4 is a circuit diagram illustrating the A/D converter of FIG. 2 in greater detail.

For simplicity of explanation, it is assumed that the resistors Ra and Rb have resistance of 1280Ω, n=256, the resistors R1 to Rn-1 have resistance of 10Ω, potentials of 5 V and 0 V are applied to the power-supply terminals 11 and 12, respectively, and the test terminal 21 is connected to the node of the resistor 128 and 129.

As shown in FIG. 3, a tester 15 applies a reference potential (i.e., 5 V) to the power supply terminal 11 of the IC 16 incorporating the A/D converter, a reference potential (i.e., 0 V) to the power-supply terminal 12 of the IC 16, an input signal Vin to the input terminal 13 of the IC 16, and a test potential Vt to the test terminal 21 of the IC 16. From the value of the signal Dout output from the IC 16 it is determined whether the A/D operates correctly or not.

First, a test potential Vt of 5 V is applied to the test terminal 21. The potentials V1 to V127 at the nodes of the resistors R1 to R128 are thereby set at the same value of 5 V. On the other hand, the potential Vbottom at the node B of the resistors R256 and the resistor Rb is set at 2.5 V. This is because the potential at the power-supply terminal 12 is 0 V and, hence, the potential Vbottom is 5 V×{1280/(1280+10×128)}.

Hence, the potential difference between any two adjacent nodes of the resistors R129 to R256, or between any adjacent two of the potential levels generated in the A/D converter, is approximately 20 mV, or (5−2.5)/128.

In this condition, the resistors R129 to R258 are tested.

Namely, a test potential Vt of 0 V is applied to the test terminal 21. All nodes of the resistors R129 to R256 are thereby set at the potential of 0 V. On the other hand, the potential Vtop at the node A (i.e., the node of the resistors Ra and R1) is set at 2.5 V, or 5 V×{(10×128)/(1280+10×128)}, since the potential of the power-supply terminal 11 is 5 V.

The potential difference between any two of the resistors R1 to R128, i.e., the difference between any adjacent two potential levels, is also about 20 mV, or (5−2.5)/128.

In this condition, the resistors R1 to R128 are tested.

That is, a test potential Vt of 0 V is applied from the tester 15 to the test terminal 21. The resistors R1 to R128 may be tested before the resistors R129 to R256, not after the resistors 129 to R256.

To operate the A/D converter in normal conditions after it has been tested, the test terminal 21 is opened in terms of direct current (DC). Thus, the A/D converter can detect the level of the input signal Vin and convert it to a digital signal as long as Vtop is 3.75 V (=5 V×0.75) and the Vbottom is 1.25 (=5 V×0.25). In this instance, the difference between any two adjacent potential levels is about 10 mV, ((3.75−1.25)/256).

Obviously, the difference between any adjacent two potential levels generated in the A/D converter during the test can be greater than the difference generated while the A/D converter is operating in normal conditions. It therefore suffices to supply an A/D converter with input signals Vin having a potential precision of 20 mV or less in order to test the A/D converter for every potential level by the method according to the invention, whereas it is necessary to supply the A/D converter with input signals Vin having a higher potential precision 10 mV or less, in order to test the A/D converter for every potential level while operating the converter under normal conditions. This means that the tester 15 needs to have only half the precision it would require to have in the conventional method of testing A/D converters.

One test terminal is used in the first embodiment. Nonetheless, two or more test terminals may be used. In this case, A/D converters can be tested correctly by means of a tester which has a lower precision and which is therefore less expensive. It is most desirable that the test terminal be connected between the node A and the node B, spaced apart at regular intervals from one another. In the extreme case, one test terminal may be connected each of the nodes.

Figure 5:
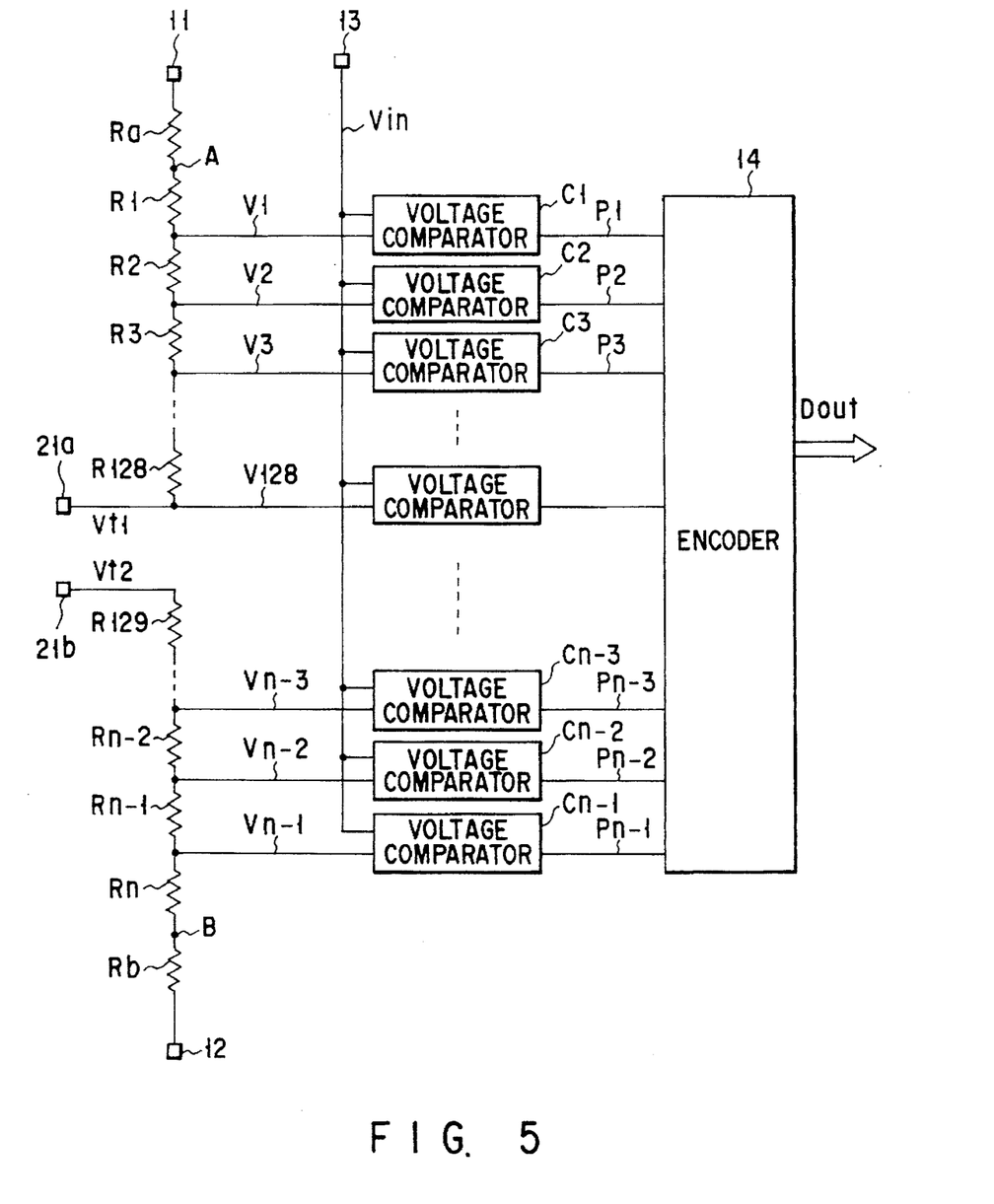

FIG. 5 shows an A/D converter which is a second embodiment of this invention.

As illustrated in FIG. 5, the A/D converter is incorporated in an IC and has two power-power supply terminals 11 and 12. A high-level reference potential (e.g., 5 V) is applied to the first power-supply terminal 11 from an power supply provided outside the IC. A low-level reference potential (e.g., 0 V) is applied to the second power-supply terminal 12 from another power supply provided outside the IC.

The A/D converter has two test terminals 21a and 21b. Resistors Ra and n/2 resistors R1 to R(n/2) are connected in series between the first power-supply terminal 11 and the first test terminal 21a. Resistors Rb and n/2 resistors R{(n/2)+1} to Rn are connected in series between the second power-supply terminal 12 and the second test terminal 21b.

If n=256, the resistors R128 and R129 will not be connected to each other. The test terminals 21a and 21b will be connected together outside the IC after the A/D converter is tested. The A/D converter can then convert an analog signal to a digital signal.

The resistors R1 to Rn are connected in series, and the resistors Ra and Rb are connected to the end of the series constituted by the resistors R1 to Rn.

The resistors Ra and Rb determine the highest and lowest level of an input signal (i.e., an analog signal) which the A/D converter can detects. Neither the resistor Ra nor the resistor Rb is required if the A/D converter is designed to detect signals at any level.

The resistors R1 to Rn determine the number of potential levels which can be provided in the A/D converter. If the A/D converter is an 8-bit converter, it requires 256 (=$2^8$) resistors R1 to R256. The resistors R1 to Rn divide the voltage applied between the node A of the resistors Ra and R1 and the node B of the resistors Rb and Rn.

To test the A/D converter, a predetermined potential Vt1 (e.g., the ground potential) is externally applied to the first test terminal 21a, and a predetermined potential Vt2 (e.g., the power-supply potential) is applied externally applied to the second test terminal 21b.

The potentials V1 to Vn-1 at the nodes of the resistors R1 to Rn are applied to n-1 voltage comparators C1 to Cn-1, respectively. An input signal Vin is supplied to the voltage comparators C1 to Cn-1 via an input terminal 13 from a device provided outside the IC. Each voltage comparator compares the potential of the input signal Vin with the penitential at the node of two adjacent resistors other than the resistors Ra and Rb.

If the potential of the input signal Vin is higher than that at the resistor node, the voltage comparator generates a high-level signal. If the potential of the input signal Vin is lower than the potential at the resistor node, the voltage comparator generates a low-level signal.

The signals P1 to Pn-1 the voltage comparators C1 to Cn-1 have generated are input to an encoder 14. The encoder 14 converts the signals P1 to Pn-1 to a digital signal Dout which consists of m bits (for example, m=8).

How to test the A/D converter described above will be explained, with reference to FIGS. 6 and 7.

Figure 6:
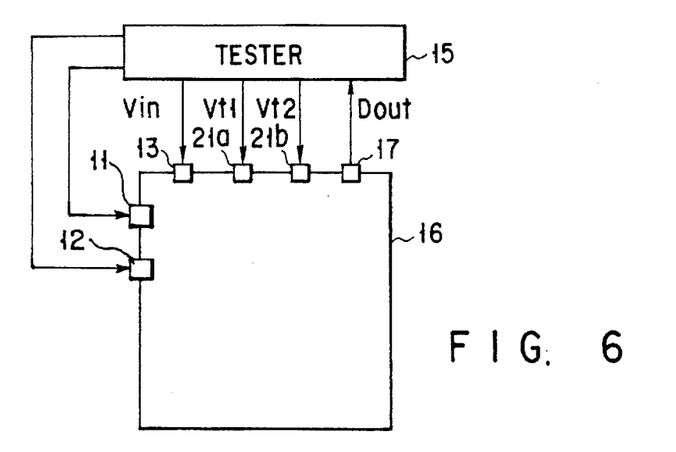
FIG. 6 is a diagram explaining how to test the A/D converter shown in FIG. 5.
Figure 7:
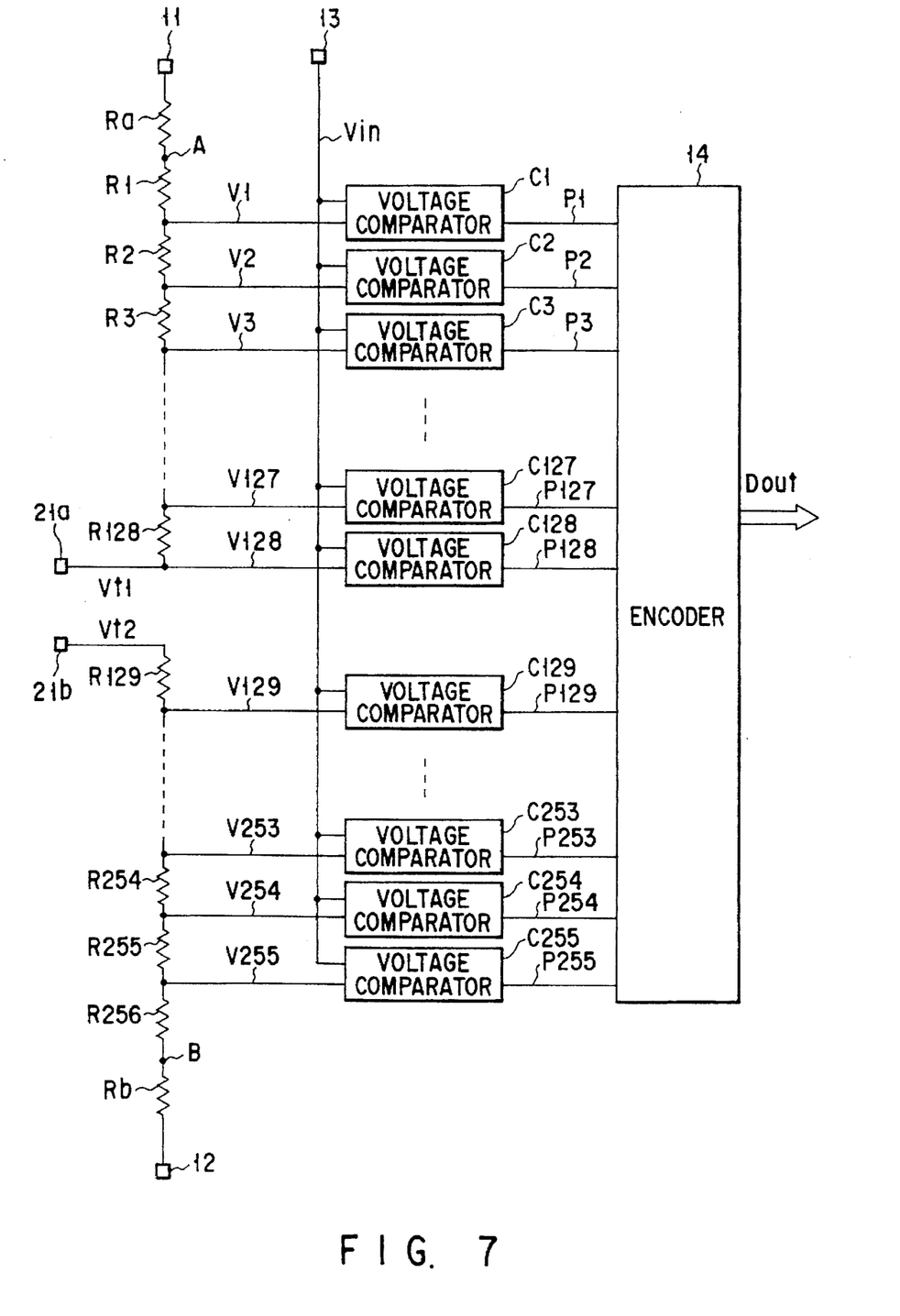
FIG. 7 is a circuit diagram illustrating the A/D converter of FIG. 5 in more detail.

For simplicity of explanation, it is assumed that the resistors Ra and Rb have resistance of 1280Ω, n=256, the resistors R1 to Rn-1 have resistance of 10Ω, and potentials of 5 V and 0 V are applied to the power-supply terminals 11 and 12, respectively.

As shown in FIG. 6, a tester 15 applies a reference potential (i.e., 5 V) to the power supply terminal 11 of the IC 16 incorporating the A/D converter, a reference potential (i.e., 0 V) to the power supply terminal 12 of the IC 16, an input signal Vin to the input terminal 13 of the IC 16, and the test potentials Vt1 and Vt2 to the test terminals 21a and 21b of the IC 16, respectively. From the value of the signal Dout output from the IC 16 it is determined whether the A/D operates correctly or not.

First, the test potential Vt2 of 5 V is applied to the second test terminal 21b. The potentials V1 to V127 at the nodes of the resistors R1 to R128 are thereby set at the same value of 5 V. On the other hand, the potential Vbottom at the node B of the resistors R256 and the resistor Rb is set at 2.5 V. This is because the potential at the power-supply terminal 12 is 0 V and, hence, the potential Vbottom is 5 V×{1280/(1280+10×128)}.

Hence, the potential difference between any two adjacent nodes of the resistors R129 to R256, or between any adjacent two of the potential levels generated in the A/D converter, is approximately 20 mV, or (5−2.5)/128.

In this condition, the resistors R129 to R258 are tested.

Namely, the a test potential Vt1 of 0 V is applied to the test terminal 21a. All nodes of the resistors R129 to R256 are thereby set at the potential of 0 V. On the other hand, the potential Vtop at the node A (i.e., the node of the resistors Ra and R1) is set at 2.5 V, or 5 V×{(10×128)/(1280+10×128))}, since the potential of the power-supply terminal 11 is 5 V.

The potential difference between any two of the resistors R1 to R128, i.e., the difference between any adjacent two potential levels, is also about 20 mV, or (5−2.5)/128.

In this condition, the resistors R1 to R128 will be tested by means of the tester 15.

The resistors R1 to R128 may be tested by applying 0 V to the first test terminal 21a before the resistors R129 to R256 by applying 5 V to the second test terminal 21b—not after the resistors R129 to R256. Alternatively, 0 V and 5 V may be simultaneously applied to the test terminals 21a and 21b, thereby to test the entire A/D converter.

For the second embodiment it is most desirable that the encoder 14 have two sections, one for converting the signals P1 to P128 output from the voltage comparators C1 to C128 into a digital signal, and the other for converting the signals P129 to P256 output from the voltage comparators C129 to C256 into a digital signal, and that the encoder therefore output two digital signals. More precisely, the encoder 14 should best have two 7-bit encoding sections which operate independently of each other.

To operate the A/D converter in normal conditions after it has been tested, the test terminals 21a and 21b are electrically connected. Thus, the A/D converter can detect the level of the input signal Vin and convert it to a digital signal as long as Vtop is 3.75 V (=5 V×0.75) and the Vbottom is 1.25 (=5 V×0.25). In this instance, the difference between any two adjacent potential levels is about 10 mV, {(3.75−1.25)/256}.

As can be understood from the above, the difference between any adjacent two potential levels generated in the A/D converter during the test can be greater than the difference generated while the A/D converter is operating in normal conditions. Therefore, it is only necessary to supply an A/D converter with input signals Vin having a potential precision of 20 mV or less in order to test the A/D converter for every potential level by the method according to the invention, whereas it is necessary to supply the A/D converter with input signals Vin having a higher potential precision 10 mV or less, in order to test the A/D converter for every potential level while operating the converter under normal conditions. This means that the tester 15 needs to have only half the precision it would require to have in the conventional method of testing A/D converters.

In the second embodiment, the test terminals 21a and 21b are connected together outside the IC 16 after the A/D converter is tested. Alternatively, they may be connected inside the IC 16. To achieve this it suffices to provide a switch element between the test terminals 21a and 21b. The switch element is opened while the A/D converter is undergoing the test, and is closed while the A/D converter is operating in normal conditions.

Figure 8:
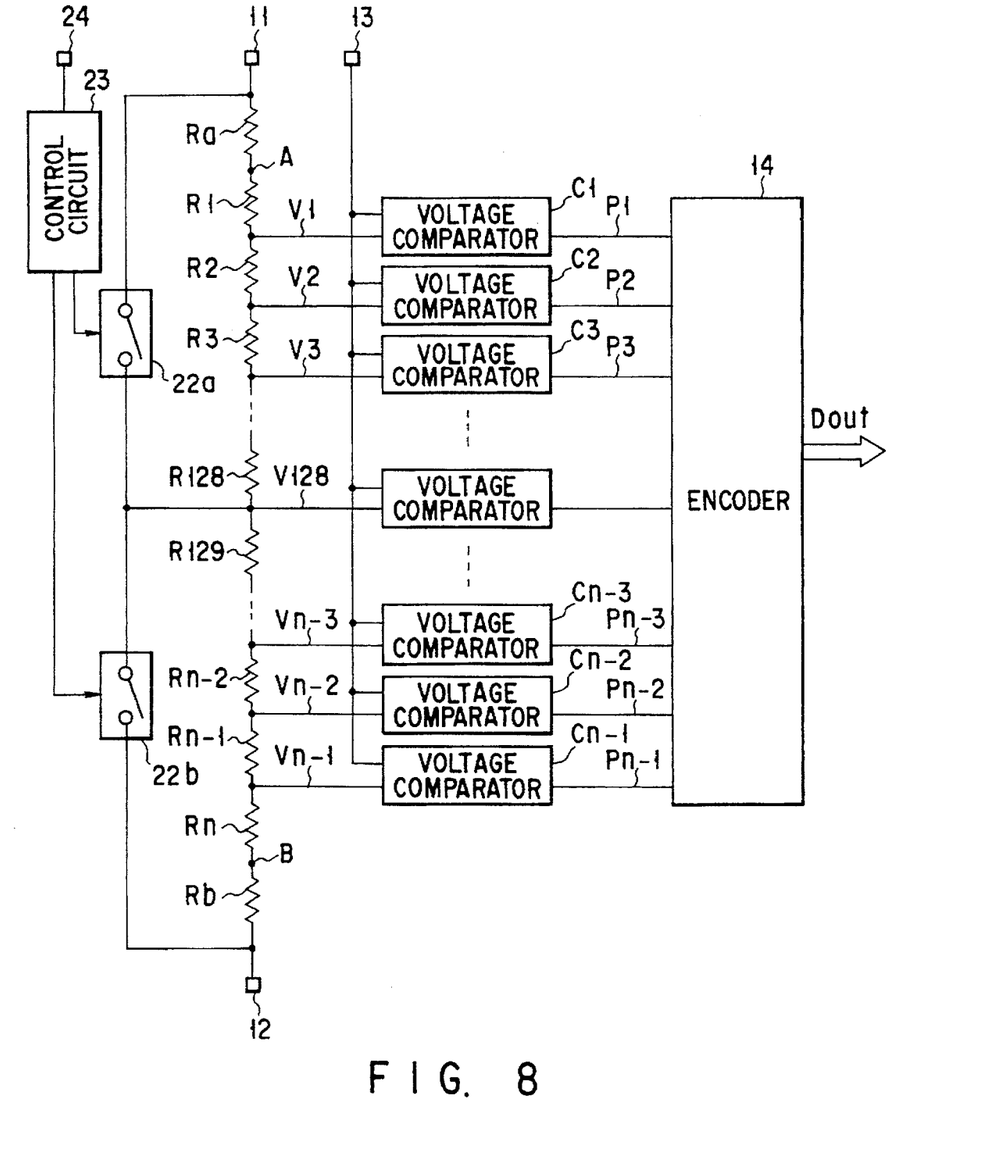
FIG. 8 a circuit diagram illustrating an A/D converter which is a third embodiment of this invention.

FIG. 8 illustrates an A/D converter which is a third embodiment of the present invention.

As shown in FIG. 8, the A/D converter, which is incorporated in an IC, has two power-power supply terminals 11 and 12. A high-level reference potential (e.g., 5 V) is applied to the first power-supply terminal 11 from an power supply provided outside the IC. A low-level reference potential (e.g., 0 V) is applied to the second power-supply terminal 12 from another power supply provided outside the IC.

Resistors Ra and Rb and n resistors R1 to Rn are connected in series between the first power-supply terminal 11 and the second power-supply terminal 12. To be more specific, the resistors R1 to Rn are connected in series, and the resistors Ra and Rb are connected to the end of the series circuit constituted by the resistors R1 to Rn.

The resistors Ra and Rb determine the highest and lowest level of an input signal (i.e., an analog signal) which the A/D converter can detects. Neither the resistor Ra nor the resistor Rb is required if the A/D converter is designed to detect signals at any level.

The resistors R1 to Rn determine the number of potential levels which can be provided in the A/D converter. If the A/D converter is an 8-bit converter, it requires 256 (=2$^8$) resistors R1 to R256. The resistors R1 to Rn divide the voltage applied between the node A of the resistors Ra and R1 and the node B of the resistors Rb and Rn.

As shown in FIG. 8, the A/D converter has two switches 22a and 22b and a control circuit 23. The first switch 22a is connected between the first power-supply terminal 11 and one of the n-1 nodes of the resistors R1 to Rn (e.g., the node of the resistor R128 and R129). The second switch 22b is connected between the second power-supply terminal 12 and said one of the n-1 nodes. The control circuit 23 controls the switches 22a and 22b independently, in accordance with a signal input from a tester provided outside the IC.

The potentials V1 to Vn-1 at the n-1 nodes of the resistors R1 to Rn are applied to n-1 voltage comparators C1 to Cn-1, respectively. An input signal Vin is supplied to the voltage comparators C1 to Cn-1 via an input terminal 13 from a device provided outside the IC 16. Each voltage comparator compares the potential of the input signal Vin with the potential at the node of two adjacent resistors other than the resistors Ra and Rb. If the potential of the input signal Vin is higher than that at the resistor node, the voltage comparator generates a high-level signal. If the potential of the input signal Vin is lower than the potential at the resistor node, the voltage comparator generates a low-level signal.

The signals P1 to Pn-1 the voltage comparators C1 to Cn-1 have Generated are input to an encoder 14. The encoder 14 converts the signals P1 to Pn-1 to a digital signal Dout which consists of m bits (for example, m=8).

How to test the A/D converter described above will be explained, with reference to FIGS. 9 and 10.

Figure 9:
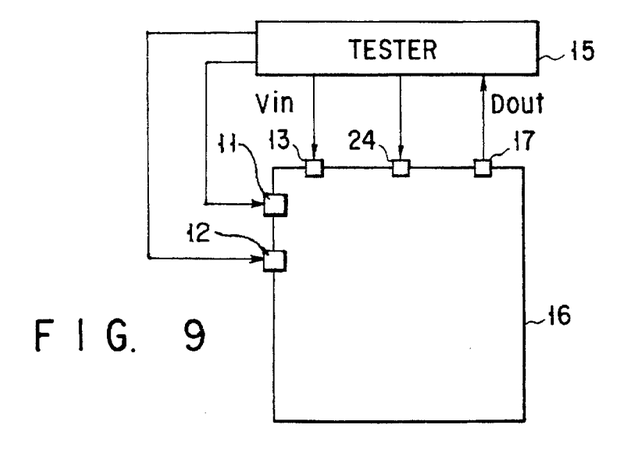
Figure 10:
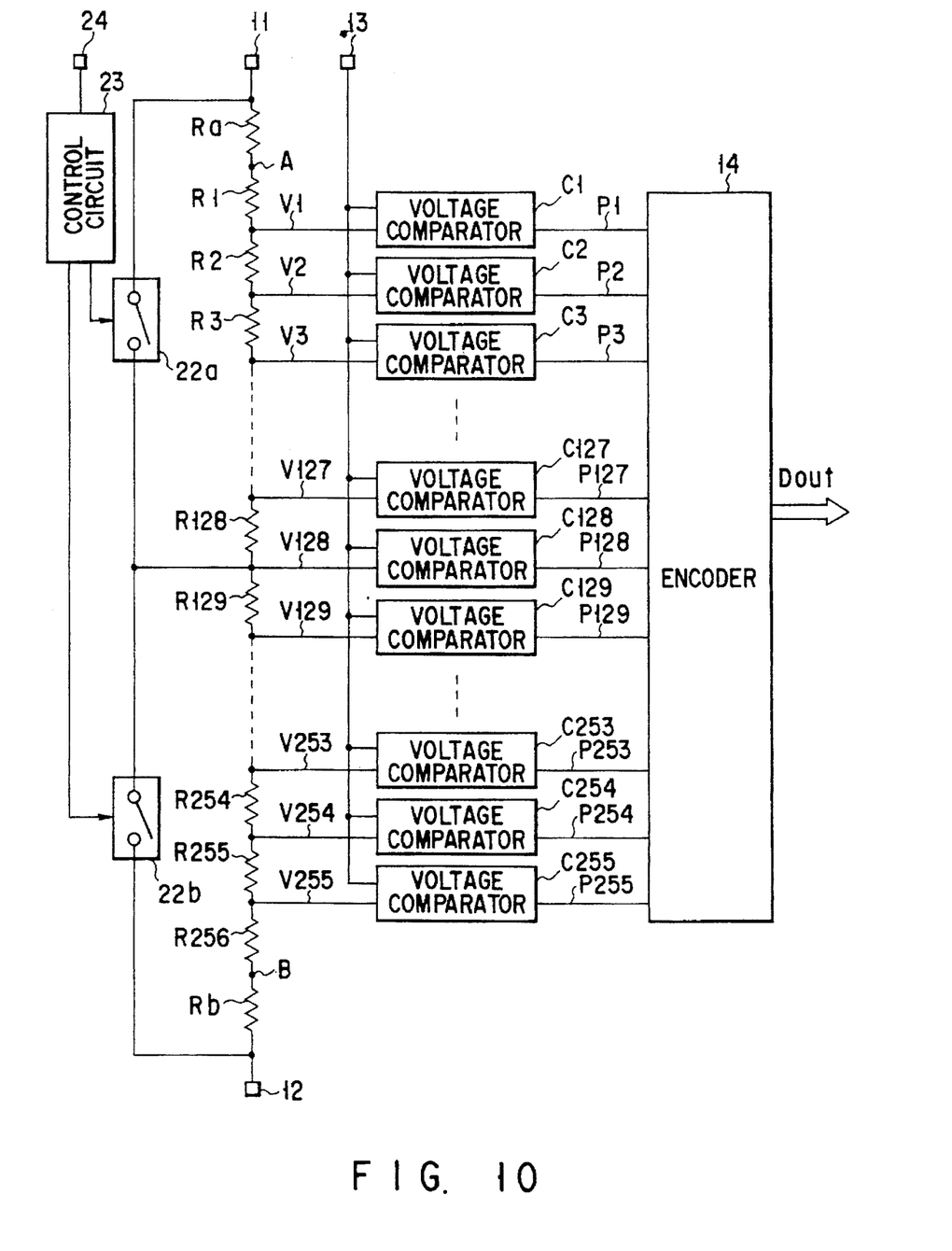
FIG. 10 is a circuit diagram showing the A/D converter of FIG. 8 in more detail.

For simplicity of explanation, it is assumed that the resistors Ra and Rb have resistance of 1280Ω, n=256, the resistors R1 to Rn-1 have resistance of 10Ω, and potentials of 5 V and 0 V are applied to the power-supply terminals 11 and 12, respectively.

As shown in FIG. 9, a tester 15 applies a reference potential (i.e., 5 V) to the power-supply terminal 11 of the IC 16 incorporating the A/D converter, a reference potential (i.e., 0 V) to the power-supply terminal 12 of the IC 16, an input signal Vin to the input terminal 13 of the IC 16, and a control signal to the test terminal 24 to control the switches 22a and 22b independently. From the value of the signal Dout output from the IC 16 it is determined whether the A/D operates correctly or not.

First, the tester 15 supplies a control signals to the test terminal 24, to turn on the first switch 22a and turn off the second switch 22b. In response to the control signal the control circuit 23 turns the switches 22a and 22b on and off, respectively. As a result, the potentials V1 to V127 at the nodes of the resistors R1 to R128 are thereby set at the same value of 5 V. On the other hand, the potential Vbottom at the node B of the resistors R256 and the resistor Rb is set at 2.5 V. This is because the potential at the power-supply terminal 12 is 0 V and, hence, the potential Vbottom is 5 V×{1280/(1280+10×128)}.

Hence, the potential difference between any two adjacent nodes of the resistors R129 to R256, or between any adjacent two of the potential levels generated in the A/D converter, is approximately 20 mV, or (5−2.5)/128.

In this condition, the resistors R129 to R258 are tested.

Namely, the tester 15 supplies a control signal via the test terminal 24a to the control circuit 23 to turn off the first switch 22a and turn on the second switch 22b. In response to the control signal the control circuit 23 turns the switches 22a and 22b off and on, respectively. As a result, the potentials V129 to V256 at the nodes of the resistors R129 to R256 are thereby set at the same value of 0 V. On the other hand, the potential Vtop at the node A (i.e., the node of the resistors Ra and R1) is set at 2.5 V, or 5 V×{(10×128)/(1280+10×128)}, since the potential of the power-supply terminal 11 is 5 V.

Hence, the potential difference between any two adjacent nodes of the resistors R1 to R128, or between any adjacent two of the potential levels generated in the A/D converter, is approximately 20 mV, or (5−2.5)/128.

In this condition, the resistors R1 to R128 will be tested by means of the tester 15.

The resistors R1 to R128 may be tested by turning the switches 22a and 22b off and on, respectively, before the resistors R129 to R256 are tested by turning the switches 22a and 22b on and off, respectively—not after the resistors R129 to R256.

To operate the A/D converter in normal conditions after it has been tested, the tester 15 supplies a control signal via the test terminal 24a to the control circuit 23 to turn off both switches 22a and 22b. Thus, the A/D converter can detect the level of the input signal Vin and convert it to a digital signal as long as Vtop is 3.75 V (=5 V×0.75) and the Vbottom is 1.25 (=5 V×0.25). In this instance, the difference between any two adjacent potential levels is about about 10 mV, {(3.75−1.25)/256}.

In the third embodiment, the switches 22a and 22b are turned on and off, respectively, and vice versa. The difference between any adjacent two potential levels generated in the A/D converter during the test can thereby be made greater than the difference between any adjacent two potential levels generated while the A/D converter is operating in normal conditions. Thus, it is only necessary to supply an A/D converter with input signals Vin having a potential precision of 20 mV or less in order to test the A/D converter for every potential level by the method according to the invention, whereas it is necessary to supply the A/D converter with input signals Vin having a higher potential precision 10 mV or less, in order to test the A/D converter for every potential level while operating the converter under normal conditions. That is, the tester 15 needs to have only half the precision it would require to have in the conventional method of testing A/D converters.

The A/D converter which is the third embodiment has two switches 22a and 22b. It may have three or more switches, instead. It can then be tested, not affected by noise, by means of a tester which has a lower precision and which is therefore less expensive. In this case, the switches are connected in series, constituting a series circuit one end of which is connected to either the first power-supply terminal 11 or the second power-supply terminal 12, and the nodes of the switches are connected to some nodes of the resistors R1 to Rn, respectively.

Figure 11:
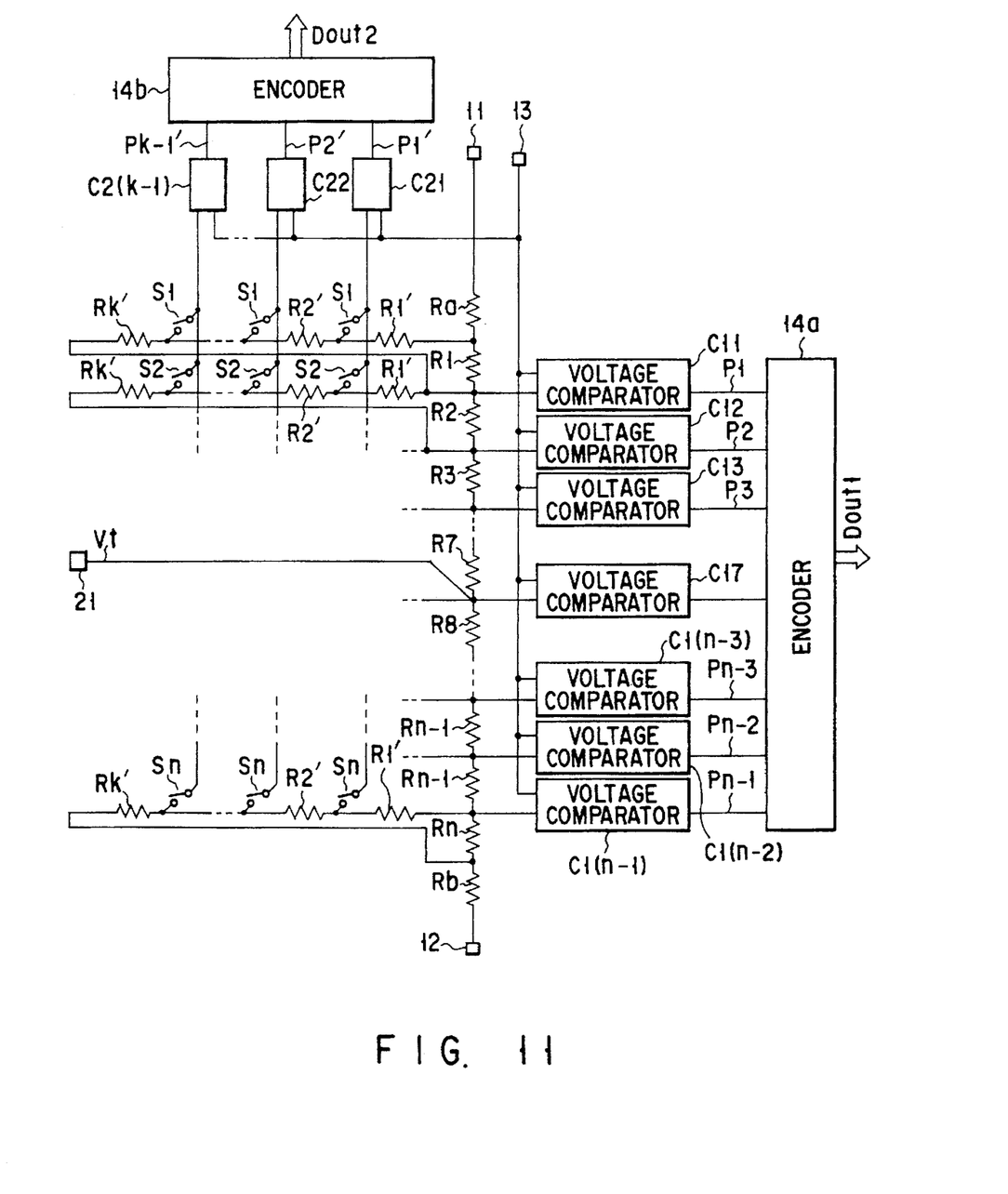
FIG. 11 a circuit diagram illustrating an A/D converter which is a fourth embodiment of the invention.

FIG. 11 shows a series-parallel type A/D converter which is the fourth embodiment of this invention.

As shown in FIG. 11, this A/D converter, which is incorporated in an IC, has two power-power supply terminals 11 and 12. A high-level reference potential (e.g., 5 V) is applied to the first power-supply terminal 11 from an power supply provided outside the IC. A low-level reference potential (e.g., 0 V) is applied to the second power-supply terminal 12 from another power supply provided outside the IC.

Resistors Ra and Rb and n resistors R1 to Rn are connected in series between the first power-supply terminal 11 and the second power-supply terminal 12. To be more specific, the resistors R1 to Rn are connected in series, and the resistors Ra and Rb are connected to the end of the series constituted by the resistors R1 to Rn.

The resistors Ra and Rb determine the highest and lowest level of an input signal (i.e., an analog signal) which the A/D converter can detects. Neither the resistor Ra nor the resistor Rb is required if the A/D converter is designed to detect signals at any level. On the other hand, the resistors R1 to Rn determine the number of potential levels which can be provided in the A/D converter.

The A/D converter further comprises k resistor series circuits connected in parallel to the resistors R1 to Rn, respectively. Each resistor series circuit consists of k resistors R1' to Rk'. If the A/D converter is an 8-bit converter, it requires 16 resistors R1 to R16 (n=16) and 16 resistor series circuits (k=16) each consisting of resistors R1' to Rk'. The 16 resistor series circuits divide the voltage applied between the node A of the resistors Ra and R1 and the node B of the resistors Rb and Rn.

At least one of the n-1 nodes among the resistors R1 to Rn is connected to a test terminal 21 to which a predetermined potential is applied. In the fourth embodiment, the midpoint of the series formed of the resistors R1 to Rn (the node of the resistors R7 and R8, if n=16) is connected to the test terminal 21. To test the A/D converter, the predetermined potential Vt (e.g., the power-supply potential or the ground potential) is applied to the test terminal 21 from a power supply provided outside the IC.

The potentials V1 to Vn-1 at the nodes of the resistors R1 to Rn are applied to n-1 voltage comparators C11 to C1(n-1), respectively. An input signal Vin is supplied to the voltage comparators C11 to C1(n-1) via an input terminal 13 from a device provided outside the IC. Hence, each voltage comparator compares the potential of the input signal Vin with the potential at the node of two adjacent resistors other than the resistors Ra and Rb. If the potential of the input signal Vin is higher than that at the resistor node, the voltage comparator generates a high-level signal. If the potential of the input signal Vin is lower than the potential at the resistor node, the voltage comparator generates a low-level signal.

The signals P1 to Pn-1 the voltage comparators C11 to C1(n-1) have generated are input to an encoder 14a. The encoder 14a converts the signals P1 to Pn-1 to a digital code Dout1.

The potentials V1 to Vk-1 at the nodes of the k resistor series circuits are applied to k-1 voltage comparators C21 to C2(k-1), respectively. The input signal Vin is supplied to the voltage comparators C21 to C2(n-1) via an input terminal 13. Hence, each of the voltage comparators C21 to C2(n-1) compares the potential of the input signal Vin with the potential at the node of two adjacent resistor series circuits. If the potential of the input signal Vin is higher than that at the node of the resistor series circuits, the voltage comparator generates a high-level signal. If the potential of the input signal Vin is lower than the potential at the node of the resistor series circuits, the voltage comparator generates a low-level signal.

The signals P1' to Pk-1' the voltage comparators C21 to C2(n-1) have generated are input to an encoder 14b. The encoder 14b converts the signals P1' to Pk-1' to a digital code Dout2.

Since a predetermined potential is applied from a tester to the test terminal 21, the difference between any adjacent two potential levels generated in the A/D converter during the test can be greater than the difference generated while the A/D converter is operating in normal conditions.

One test terminal is used in the fourth embodiment. Nonetheless, two or more test terminals may be used. In this case, A/D converters can be tested correctly, not affected by noise, by means of a tester which has a lower precision and which is therefore less expensive. It is most desirable that the test terminal be connected between the node A and the node B, spaced apart at regular intervals from one another. In the extreme case, one test terminal may be connected each of the nodes.

Figure 12:
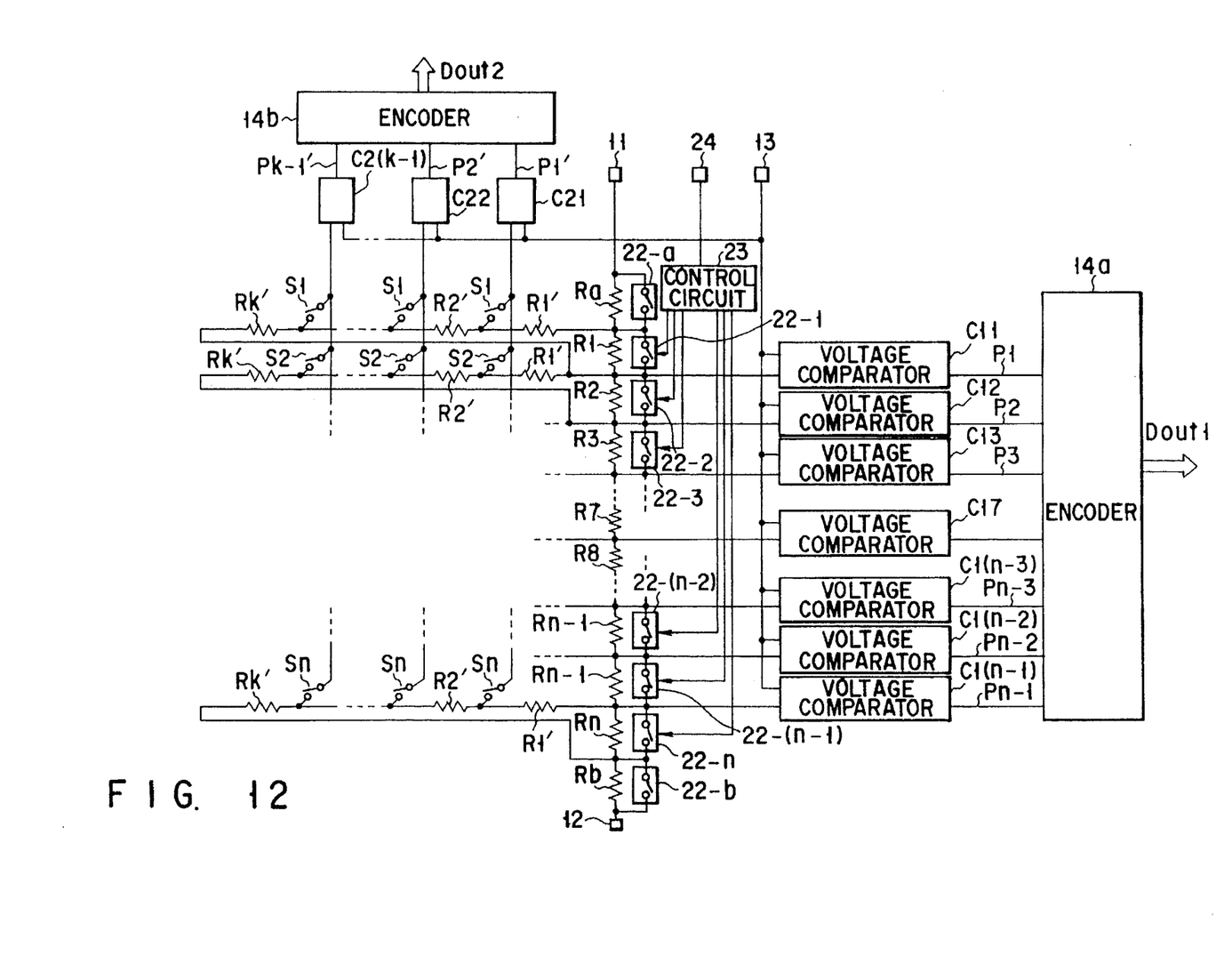
FIG. 12 a circuit diagram illustrating an A/D converter which is a fifth embodiment of this invention.

FIG. 12 shows a series-parallel type A/D converter which is the fourth embodiment of the invention.

As shown in FIG. 12, the A/D converter, which is incorporated in an IC, has two power-power supply terminals 11 and 12. A high-level reference potential (e.g., 5 V) is applied to the first power-supply terminal 11 from an power supply provided outside the IC. A low-level reference potential (e.g., 0 V) is applied to the second power-supply terminal 12 from another power supply provided outside the IC.

Resistors Ra and Rb and n resistors R1 to Rn are connected in series between the first power-supply terminal 11 and the second power-supply terminal 12. To be more specific, the resistors R1 to Rn are connected in series, and the resistors Ra and Rb are connected to the end of the series constituted by the resistors R1 to Rn.

The resistors Ra and Rb determine the highest and lowest level of an input signal (i.e., an analog signal) which the A/D converter can detects. Neither the resistor Ra nor the resistor Rb is required if the A/D converter is designed to detect signals at any level. On the other hand, the n resistors R1 to Rn determine the number of potential levels which can be provided in the A/D converter.

The A/D converter further comprises k resistor series circuits connected in parallel to the resistors R1 to Rn, respectively. Each resistor series circuit consists of k resistors R1' to Rk'. If the A/D converter is an 8-bit converter, it requires 16 resistors R1 to R16 (n=16) and 16 resistor series circuits (k=16) each consisting of resistors R1' to Rk'. The 16 resistor series circuits divide the voltage applied between the node A of the resistors Ra and R1 and the node B of the resistors Rb and Rn.

As shown in FIG. 12, the A/D converter has switches 22-a, 22-b and 22-1 to 22-n and a control circuit 23. The control circuit 23 controls the switches 22-a, 22-b and 22-1 to 22-n independently, in accordance with a signal input via a test terminal 24 from a tester provided outside the IC.

The potentials V1 to Vn-1 at the nodes of the resistors R1 to Rn are applied to n-1 voltage comparators C11 to C1(n-1), respectively. An input signal Vin is supplied to the voltage comparators C11 to C1(n-1) via an input terminal 13 from a device provided outside the IC. Hence, each voltage comparator compares the potential of the input signal Vin with the potential at the node of two adjacent resistors other than the resistors Ra and Rb. If the potential of the input signal Vin is higher than that at the resistor node, the voltage comparator generates a high-level signal. If the potential of the input signal Vin is lower than the potential at the resistor node, the voltage comparator generates a low-level signal.

The signals P1 to Pn-1 the voltage comparators C11 to C1(n-1) have generated are input to an encoder 14a. The encoder 14a converts the signals P1 to Pn-1 to a digital code Dout1.

The potentials V1 to Vk-1 at the nodes of the k resistor series circuits are applied to k-1 voltage comparators C21 to C2(k-1), respectively. The input signal Vin is supplied to the voltage comparators C21 to C2(n-1) via an input terminal 13. Hence, each of the voltage comparators C21 to C2(n-1) compares the potential of the input signal Vin with the potential at the node of two adjacent resistor series circuits. If the potential of the input signal Vin is higher than that at the node of the resistor series circuits, the voltage comparator generates a high-level signal. If the potential of the input signal Vin is lower than the potential at the node of the resistor series circuits, the voltage comparator generates a low-level signal.

The signals P1' to Pk-1' the voltage comparators C21 to C2(n-1) have generated are input to an encoder 14b. The encoder 14b converts the signals P1' to Pk-1' to a digital code Dout2.

Since the switches 22-a, 22-b and 22-1 to 22-n are turned on and off, the difference between any adjacent two potential levels Generated in the A/D converter during the test can be greater than the difference generated while the A/D converter is operating in normal conditions. One switch is provided for each of the resistors Ra, Rb and R1 to Rn. Instead, two or more switches may be provided between one mode and another mode. In this case, A/D converters can be tested correctly, not affected by noise, by means of a tester which has a lower precision and which is therefore less expensive.

As has been described, the A/D converter and the method of testing the A/D converter, both according to the present invention, are advantageous in the following respects:

First, since a predetermined potential is applied from a tester to a test terminal connected to at least one of the nodes of the resistors, the difference between any adjacent two potential levels generated in the A/D converter at the test carried before the shipment can be made greater than the difference generated while the A/D converter is operating in normal conditions.

Second, since a switch connected between a power-supply terminal and at least one of the nodes is turned on and off by a signal supplied from a tester via a test terminal, the difference between any adjacent two potential levels generated in the A/D converter at the test carried before the shipment can be made greater than the difference generated while the A/D converter is operating in normal conditions.

Third, the tester used in testing the A/D converter by the method according to the invention only needs to have a precision lower than it would require to have in the case where the A/D converter is tested while being operated in normal conditions. In other words, a tester of low precision can be used in the method according to the invention. Hence, the A/D converter can be tested correctly, not affected by noise, by an analog tester which has a lower precision and which is therefore less expensive.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An A/D converter comprising:

a first power-supply terminal for receiving a first potential;

a second power-supply terminal for receiving a second potential;

an input terminal for receiving an analog signal;

a first group of resistors connected in series to form nodes having a first series of different potentials in a first series circuit having one end connected to said first power-supply terminal;

a second group of resistors connected in series to form nodes having a second series of different potentials in a second series circuit having one end connected to said second power-supply terminal;

a plurality of comparators connected to the nodes of said resistors of the first and second groups, respectively, each for comparing a potential of the analog signal with a potential at one node of said resistors of the first and second groups and generating a signal;

an encoder for converting the signals generated by said comparators of the first and second groups, into a digital signal;

a first test terminal connected to another end of the first series circuit formed by said resistors of the first group, for applying a third potential to the another end of the first series circuit formed by said resistors of the first group; and a second test terminal connected to another end of the second series circuit formed by said resistors of the second group, for applying a fourth potential to the another end of the second series circuit formed by said resistors of the second group.

2. The A/D converter according to claim 1, wherein the third potential is equal to the second potential, and the fourth potential is equal to the first potential.

3. The A/D converter according to claim 2, wherein the first potential is a high-level reference potential, and the second potential is a low-level reference potential.

4. The A/D converter according to claim 1, wherein said first and second test terminals are electrically connected to each other while the A/D converter is operating in normal conditions.

5. An A/D converter comprising:

a first power-supply terminal for receiving a first potential;

a second power-supply terminal for receiving a second potential;

an input terminal for receiving an analog signal;

a plurality of resistors connected in series between said first and said second power-supply terminals to form nodes having different potentials;

a plurality of comparators connected to the nodes of said resistors, respectively, each for comparing a potential of the analog signal with a potential at one of the nodes of said resistors and generating a signal;

an encoder for converting the signals generated by said comparators into a digital signal;

a first switch connected between said first power-supply terminal and one of the nodes of said resistors, said first switch electrically connecting said first power-supply terminal to said one of the nodes of said resistors;

a second switch connected between said second power-supply terminal and said one of the nodes of said resistors, said second switch electrically connecting said second power-supply terminal to said one of the nodes of said resistors;

a test terminal for receiving a test signal; and a control circuit for turning said first switch on and said second switch off, or vice versa, in accordance with the test signal supplied from said test terminal.

6. The A/D converter according to claim 5, wherein the first potential is a high-level reference potential, and the second potential is a low-level reference potential.

7. An A/D converter comprising:

a first power-supply terminal for receiving a first potential;

a second power-supply terminal for receiving a second potential;

an input terminal for receiving an analog signal;

a plurality of resistors connected in series between said first and second power-supply terminals to form nodes having different potentials;

a plurality of comparators connected to the nodes of said resistors, respectively, each for comparing a potential of the analog signal with a potential at one of the nodes of said resistors and generating a signal;

an encoder for converting the signals generated by said comparators into a digital signal;

a first switch connected between said first power-supply terminal and one of the nodes of said resistors, said first switch electrically connecting said first power-supply terminal to said one of the nodes of said resistors;

a second switch connected between said second power-supply terminal and said one of the nodes of said resistors, said second switch electrically connecting said second power-supply terminal to said one of the nodes of said resistors; and wherein said first switch and said second switch remain off while said A/D converter is operating in normal conditions.

8. A method of testing an A/D converter, comprising the steps of:

connecting a first group of resistors in series between a first test terminal and a first power-supply terminal for receiving a first potential;

connecting a second group of resistors in series between a second test terminal and a second power-supply terminal for receiving a second potential;

applying the second potential to said first test terminal, thereby to test the resistors connected between said first power-supply terminal and said first test terminal; and applying the first potential to said second test terminal, thereby to test the resistors connected between said second power-supply terminal and said second test terminal.

9. The method according to claim 8, wherein said first and second test terminals are electrically connected to each other while the A/D converter is operating in normal conditions.

10. A method of testing an A/D converter having a first power-supply terminal for receiving a first potential, a second power-supply terminal for receiving a second potential, and a plurality of resistors connected in series between the first and second power-supply terminals, forming nodes, said method comprising the steps of:

connecting a first switch between the first power-supply terminal and one of the nodes of said resistors;

connecting a second switch between the second power-supply terminal and said one of the nodes of said resistors;

turning said first and second switches off and on, respectively, thereby to test the resistors connected between said first power-supply terminal and said one node of said resistors; and turning said first and second switches on and off, respectively, thereby to test the resistors connected between said second power-supply terminal and said one node of said resistors.

11. The method according to claim 10, wherein said first switch and said second switch remain off while the A/D converter is operating in normal conditions.

* * * * *